United States Patent
Sadowski et al.

(10) Patent No.: US 11,061,429 B2
(45) Date of Patent: Jul. 13, 2021

(54) FINE-GRAINED SPEED BINNING IN AN ACCELERATED PROCESSING DEVICE

(71) Applicant: Advanced Micro Devices, Inc., Sunnyvale, CA (US)

(72) Inventors: Greg Sadowski, Boxborough, MA (US); Shomit N. Das, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 191 days.

(21) Appl. No.: 15/795,214

(22) Filed: Oct. 26, 2017

(65) Prior Publication Data

US 2019/0129463 A1 May 2, 2019

(51) Int. Cl.
| | | |
|---|---|---|
| *G06F 1/08* | (2006.01) | |
| *G01R 31/317* | (2006.01) | |
| *G01R 31/28* | (2006.01) | |
| *H03K 5/00* | (2006.01) | |
| *G11C 7/22* | (2006.01) | |

(52) U.S. Cl.
CPC ........... *G06F 1/08* (2013.01); *G01R 31/2894* (2013.01); *G01R 31/31718* (2013.01); *G01R 31/31725* (2013.01); *G01R 31/31727* (2013.01); *G11C 7/222* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 6,694,492 | B1* | 2/2004 | Shakkarwar | G01R 31/3172 257/E21.525 |
| 7,539,893 | B1* | 5/2009 | Ferguson | G01R 31/31718 714/6.1 |
| 2008/0077818 | A1* | 3/2008 | Rauschmayer | G06F 1/04 713/400 |
| 2009/0153182 | A1* | 6/2009 | Yamaoka | H03K 19/00346 326/16 |
| 2009/0278576 | A1* | 11/2009 | Chakravarty | G01R 31/31725 327/141 |
| 2010/0017042 | A1* | 1/2010 | Lopata | G06F 1/3203 700/286 |

(Continued)

*Primary Examiner* — Jaweed A Abbaszadeh
*Assistant Examiner* — Cheri L Harrington
(74) *Attorney, Agent, or Firm* — Volpe Koenig (57) ABSTRACT

A technique for fine-granularity speed binning for a processing device is provided. The processing device includes a plurality of clock domains, each of which may be clocked with independent clock signals. The clock frequency at which a particular clock domain may operate is determined based on the longest propagation delay between clocked elements in that particular clock domain. The processing device includes measurement circuits for each clock domain that measure such propagation delay. The measurement circuits are replica propagation delay paths of actual circuit elements within each particular clock domain. A speed bin for each clock domain is determined based on the propagation delay measured for the measurement circuits for a particular clock domain. Specifically, a speed bin is chosen that is associated with the fastest clock speed whose clock period is longer than the slowest propagation delay measured for the measurement circuit for the clock domain.

20 Claims, 7 Drawing Sheets

(56) References Cited

U.S. PATENT DOCUMENTS

| | | | | |
|---|---|---|---|---|
| 2011/0119672 A1* | 5/2011 | Ramaraju | ............ | G06F 9/5044 |
| | | | | 718/102 |
| 2012/0013408 A1* | 1/2012 | Cortadella | ............ | G06F 17/505 |
| | | | | 331/34 |
| 2013/0103670 A1* | 4/2013 | Kashyap | ........... | G06F 16/24532 |
| | | | | 707/714 |
| 2013/0318539 A1* | 11/2013 | Dighe | ................ | G06F 9/54 |
| | | | | 718/105 |
| 2014/0281610 A1* | 9/2014 | Biswas | ................. | G06F 1/324 |
| | | | | 713/322 |
| 2016/0147249 A1* | 5/2016 | Gendler | ................. | G06F 1/324 |
| | | | | 713/501 |
| 2016/0350158 A1* | 12/2016 | Mealey | ............... | G06F 9/5038 |
| 2017/0212572 A1* | 7/2017 | Ragland | ............. | G06F 15/7807 |
| 2018/0103088 A1* | 4/2018 | Blainey | ................. | H04L 67/42 |

* cited by examiner

FINE-GRAINED SPEED BINNING IN AN ACCELERATED PROCESSING DEVICE

BACKGROUND

Speed binning is a process by which a clock speed is selected for running a processing device. Improvements to this process are constantly being made.

BRIEF DESCRIPTION OF THE DRAWINGS

A more detailed understanding can be had from the following description, given by way of example in conjunction with the accompanying drawings wherein.

DETAILED DESCRIPTION

A technique for fine-granularity speed binning for a processing device is provided. In typical speed binning, an entire device is "binned" into a speed class based on one or more tests. The processing device of the present disclosure operates at a more granular level. Specifically, the processing device of the present disclosure includes a plurality of clock domains, each of which may be clocked with independent clock signals. Due to process variations in the manufacture of the device, the different clock domains may be operable at different clock frequencies. The clock frequency at which a particular clock domain may operate is determined based on the longest propagation delay between clocked elements in that particular clock domain. The processing device includes measurement circuits for each clock domain that measure such propagation delay. The measurement circuits are replica propagation delay paths of actual circuit elements within each particular clock domain. A speed bin for each clock domain is determined based on the propagation delay measured for the measurement circuits for a particular clock domain. Specifically, a speed bin is chosen that is associated with the fastest clock speed whose clock period is longer than the slowest propagation delay measured for the measurement circuit for the clock domain.

Figure 1:
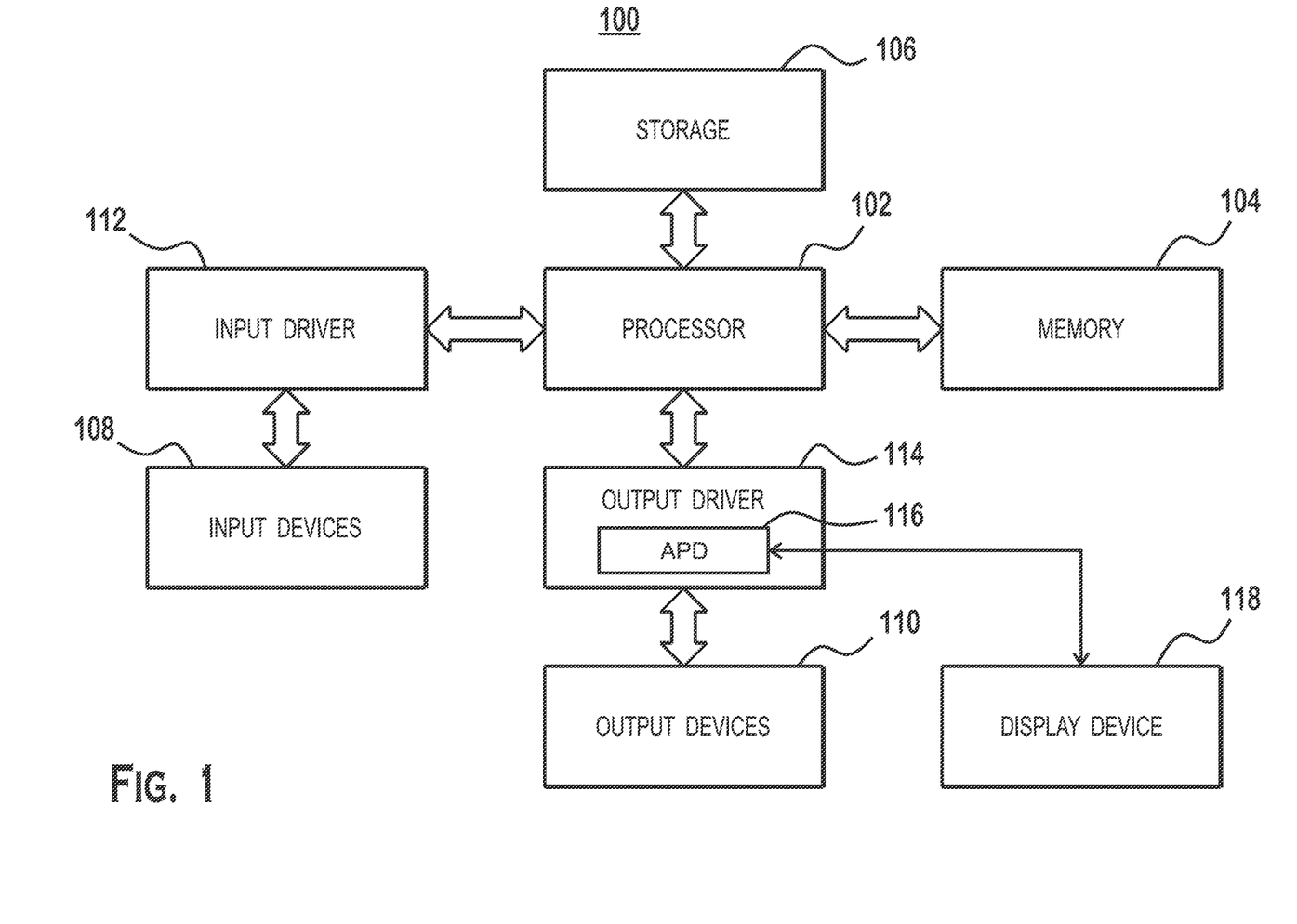
FIG. 1 is a block diagram of an example device in which one or more features of the disclosure can be implemented.

FIG. 1 is a block diagram of an example device 100 in which one or more features of the disclosure can be implemented. The device 100 could be one of, but is not limited to, for example, a computer, a gaming device, a handheld device, a set-top box, a television, a mobile phone, a tablet computer, or other computing device. The device 100 includes a processor 102, a memory 104, a storage 106, one or more input devices 108, and one or more output devices 110. The device 100 also includes one or more input drivers 112 and one or more output drivers 114. Any of the input drivers 112 are embodied as hardware, a combination of hardware and software, or software, and serve the purpose of controlling input devices 112 (e.g., controlling operation, receiving inputs from, and providing data to input drivers 112). Similarly, any of the output drivers 114 are embodied as hardware, a combination of hardware and software, or software, and serve the purpose of controlling output devices 114 (e.g., controlling operation, receiving inputs from, and providing data to output drivers 114). It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, without limitation, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 and output driver 114 include one or more hardware, software, and/or firmware components that are configured to interface with and drive input devices 108 and output devices 110, respectively. The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. The output driver 114 includes an accelerated processing device ("APD") 116 which is coupled to a display device 118, which, in some examples, is a physical display device or a simulated device that uses a remote display protocol to show output. The APD 116 is configured to accept compute commands and graphics rendering commands from processor 102, to process those compute and graphics rendering commands, and to provide pixel output to display device 118 for display. As described in further detail below, the APD 116 includes one or more parallel processing units configured to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and configured to provide graphical output to a display device 118. For example, it is contemplated that any processing system that performs processing tasks in accordance with a SIMD paradigm may be configured to perform the functionality described herein. Alternatively, it is contemplated that computing systems that do not perform processing tasks in accordance with a SIMD paradigm performs the functionality described herein.

Figure 2:
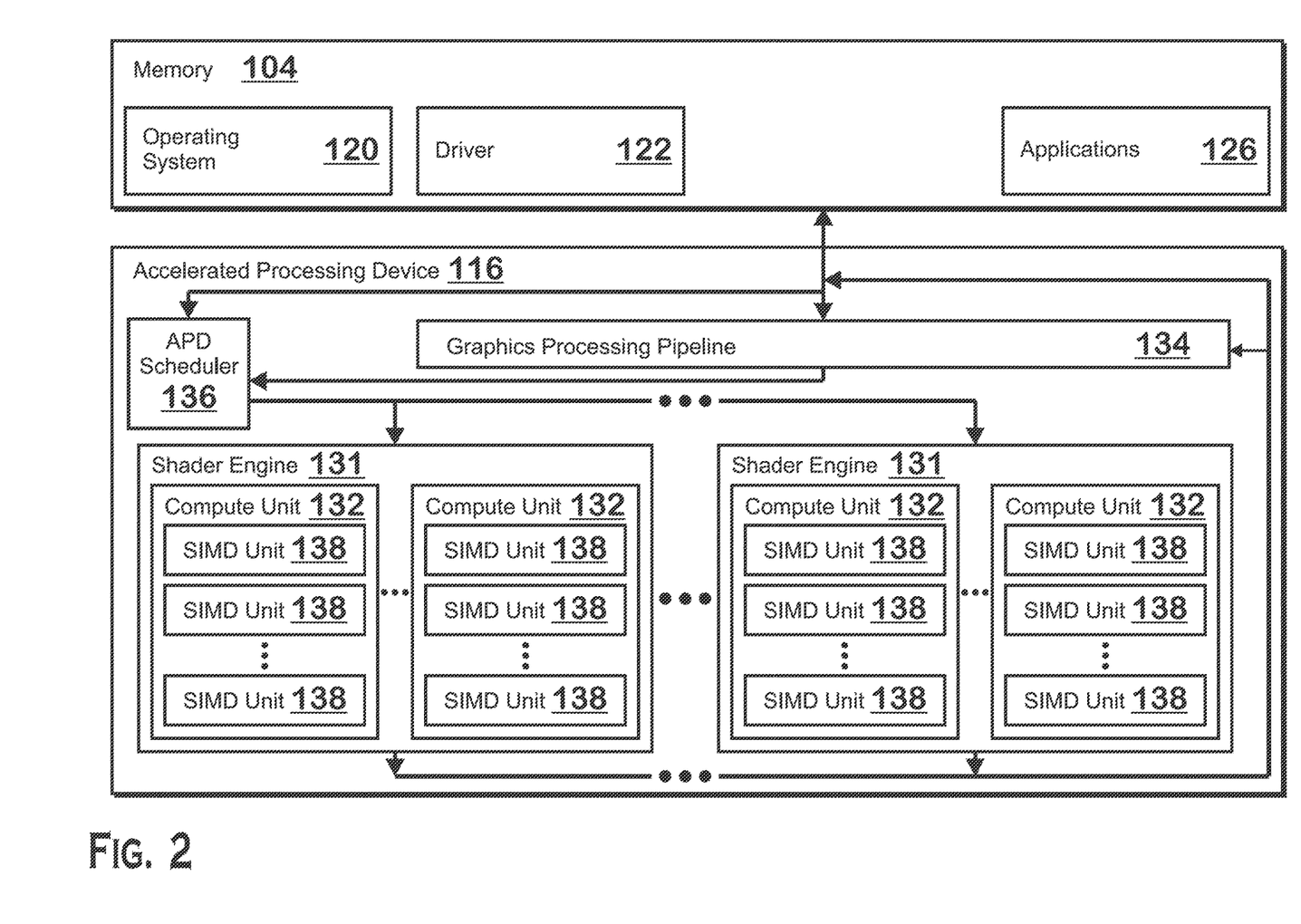
FIG. 2 illustrates details of the device of FIG. 1, according to an example.

FIG. 2 illustrates details of the device 100 and the APD 116, according to an example. The processor 102 (FIG. 1) executes an operating system 120, a driver 122, and applications 126, and may also execute other software alternatively or additionally. The operating system 120 controls various aspects of the device 100, such as managing hardware resources, processing service requests, scheduling and controlling process execution, and performing other operations. The APD driver 122 controls operation of the APD 116, sending tasks such as graphics rendering tasks or other work to the APD 116 for processing. The APD driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102.

The APD 116 includes shader engines 131, each of which includes compute units 132 that include one or more SIMD units 138 that are configured to perform operations at the request of the processor 102 (or another unit) in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously (or partially simultaneously and partially sequentially) as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed on a single SIMD unit 138 or on different SIMD units 138. Wavefronts can be thought of as the largest collection of work-items that can be executed simultaneously (or pseudo-simultaneously) on a single SIMD unit 138. "Pseudo-simultaneous" execution occurs in the case of a wavefront that is larger than the number of lanes in a SIMD unit 138. In such a situation, wavefronts are executed over multiple cycles, with different collections of the work-items being executed in different cycles. An APD scheduler 136 is configured to perform operations related to scheduling various workgroups and wavefronts on compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

Figure 3:
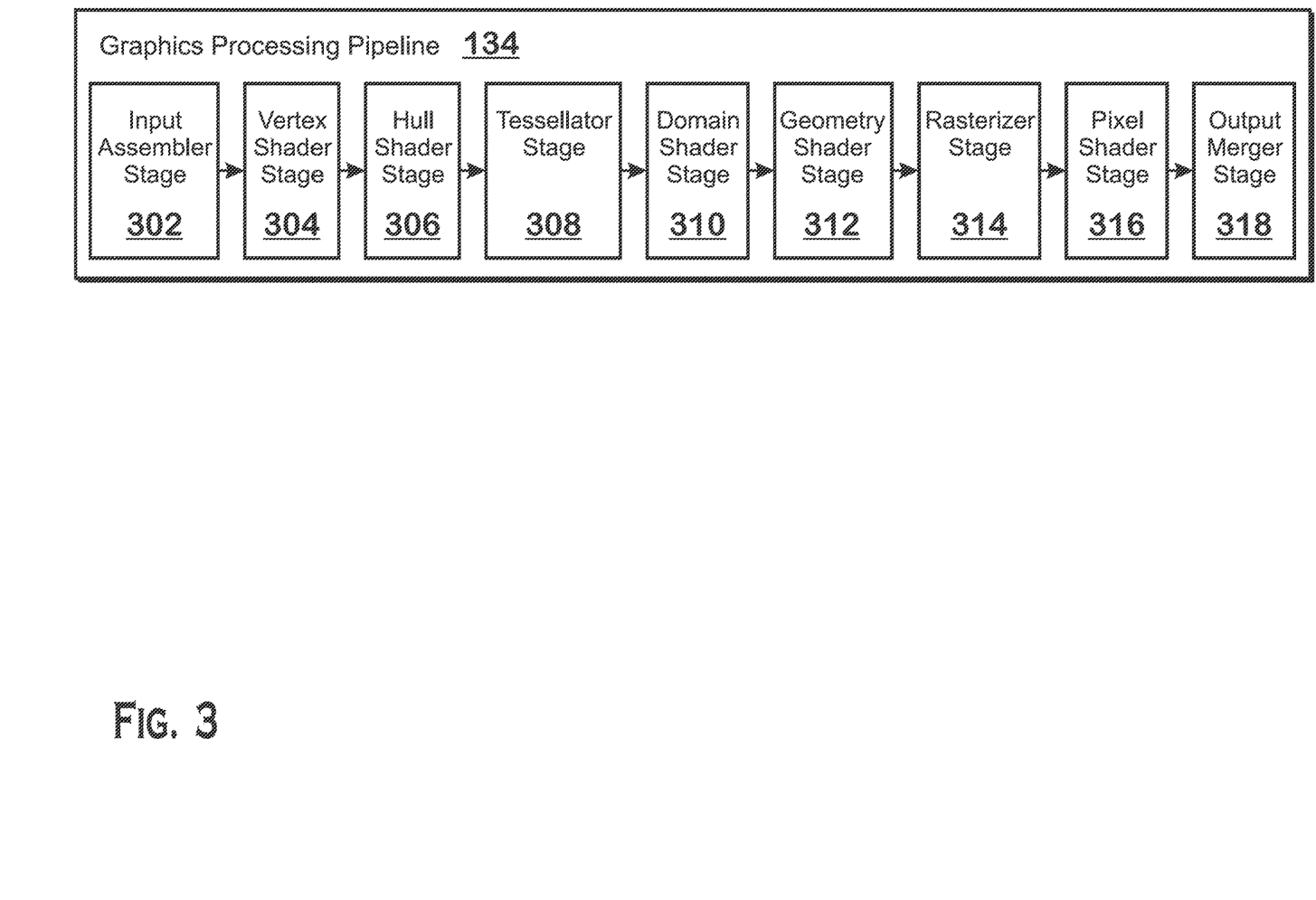
FIG. 3 is a block diagram showing additional details of the graphics processing pipeline illustrated in FIG. 2.

FIG. 3 is a block diagram showing additional details of the graphics processing pipeline 134 illustrated in FIG. 2. The graphics processing pipeline 134 includes stages that each performs specific functionality of the graphics processing pipeline 134. Each stage is implemented partially or fully as shader programs executing in the programmable compute units 132, or partially or fully as fixed-function, non-programmable hardware external to the compute units 132.

The input assembler stage 302 reads primitive data from user-filled buffers (e.g., buffers filled at the request of software executed by the processor 102, such as an application 126) and assembles the data into primitives for use by the remainder of the pipeline. The input assembler stage 302 can generate different types of primitives based on the primitive data included in the user-filled buffers. The input assembler stage 302 formats the assembled primitives for use by the rest of the pipeline.

The vertex shader stage 304 processes vertices of the primitives assembled by the input assembler stage 302. The vertex shader stage 304 performs various per-vertex operations such as transformations, skinning, morphing, and per-vertex lighting. Transformation operations include various operations to transform the coordinates of the vertices. These operations include one or more of modeling transformations, viewing transformations, projection transformations, perspective division, and viewport transformations, which modify vertex coordinates, and other operations that modify non-coordinate attributes.

The vertex shader stage 304 is implemented partially or fully as vertex shader programs to be executed on one or more compute units 132. The vertex shader programs are provided by the processor 102 and are based on programs that are pre-written by a computer programmer. The driver 122 compiles such computer programs to generate the vertex shader programs having a format suitable for execution within the compute units 132.

The hull shader stage 306, tessellator stage 308, and domain shader stage 310 work together to implement tessellation, which converts simple primitives into more complex primitives by subdividing the primitives. The hull shader stage 306 generates a patch for the tessellation based on an input primitive. The tessellator stage 308 generates a set of samples for the patch. The domain shader stage 310 calculates vertex positions for the vertices corresponding to the samples for the patch. The hull shader stage 306 and domain shader stage 310 can be implemented as shader programs to be executed on the compute units 132, that are compiled by the driver 122 as with the vertex shader stage 304.

The geometry shader stage 312 performs vertex operations on a primitive-by-primitive basis. A variety of different types of operations can be performed by the geometry shader stage 312, including operations such as point sprite expansion, dynamic particle system operations, fur-fin generation, shadow volume generation, single pass render-to-cubemap, per-primitive material swapping, and per-primitive material setup. In some instances, a geometry shader program that is compiled by the driver 122 and that executes on the compute units 132 performs operations for the geometry shader stage 312.

The rasterizer stage 314 accepts and rasterizes simple primitives (triangles) generated upstream from the rasterizer stage 314. Rasterization consists of determining which screen pixels (or sub-pixel samples) are covered by a particular primitive. Rasterization is performed by fixed function hardware.

The pixel shader stage 316 calculates output values for screen pixels based on the primitives generated upstream and the results of rasterization. The pixel shader stage 316 may apply textures from texture memory. Operations for the pixel shader stage 316 are performed by a pixel shader program that is compiled by the driver 122 and that executes on the compute units 132.

The output merger stage 318 accepts output from the pixel shader stage 316 and merges those outputs into a frame buffer, performing operations such as z-testing and alpha blending to determine the final color for the screen pixels.

Synchronous computer devices operate at a pace dictated by a clock signal. The clock speed for such computer devices are typically set in response to a binning procedure in which a maximum speed tolerable by a particular device is determined and configured into the device. Due to manufacturing process variations that result from unintended but typical variations in the manufacture of devices, different devices may have different maximum tolerable clock speeds.

Figure 4A:
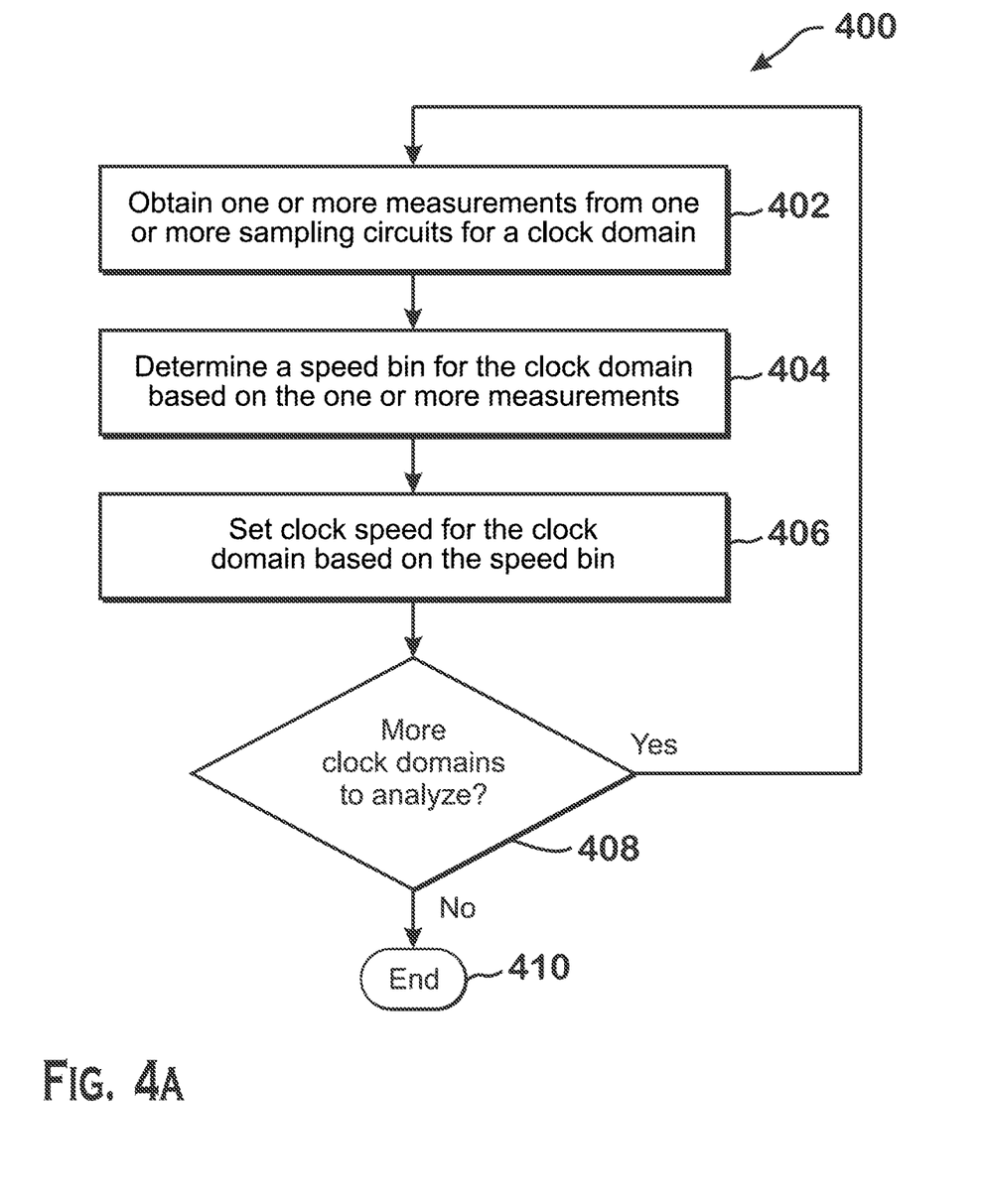
FIG. 4A is a flow diagram of a method for performing speed binning at a finer granularity than an entire accelerated processing device, according to an example.
Figure 4B:
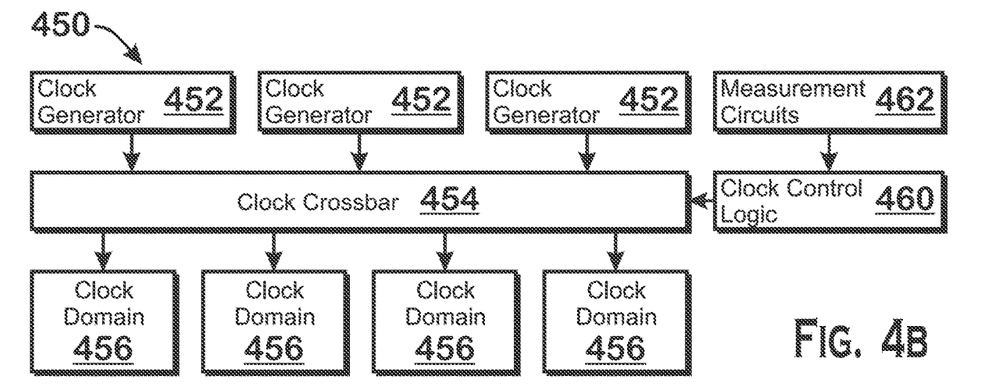
FIGS. 4B-4D illustrate example clock systems that are part of the accelerated processing device of FIG. 2.
Figure 4C:
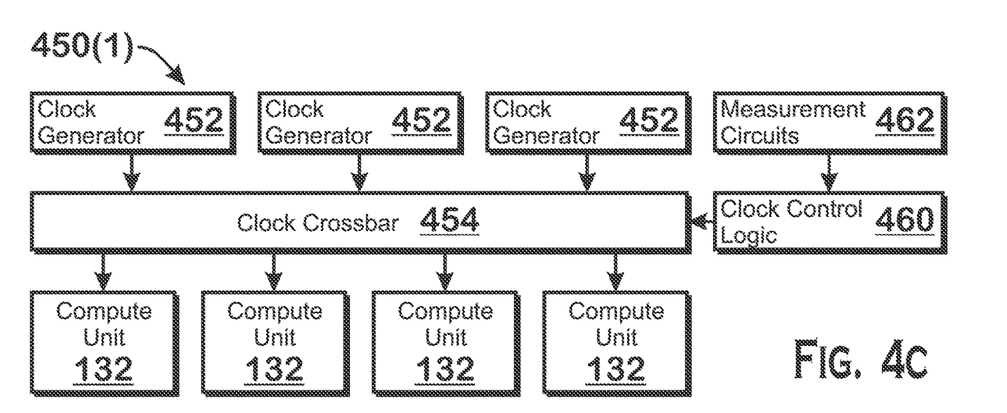
Figure 4D:
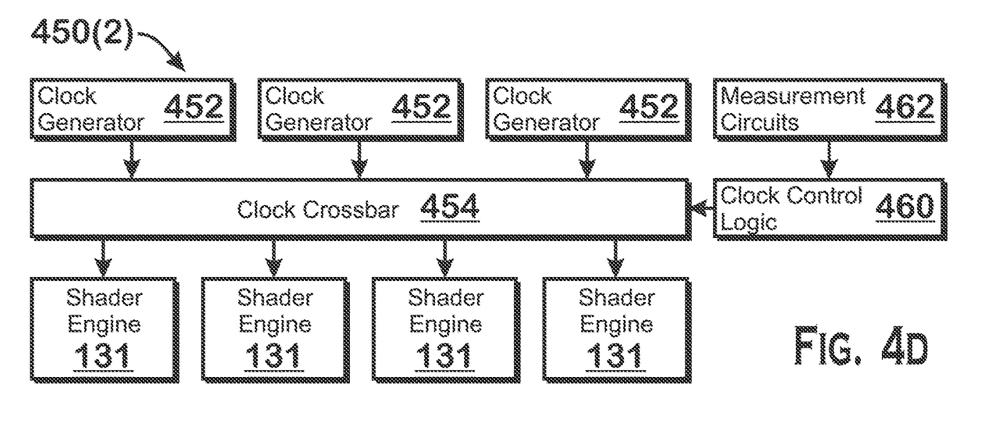

The present disclosure provides techniques for speed binning of an APD at a finer granularity than the entire APD. In other words, portions of the APD can be set to run at different clock speeds. FIG. 4A is a flow diagram of a method 400 for performing speed binning at a finer granularity than an entire APD, according to an example. FIG. 4B is a schematic diagram of a system for providing different clock speeds within a single device (e.g., computer chip or other single device typically driven with a clock signal of a single speed). Although described with respect to the system of FIGS. 1-3 and 4A, those of skill in the art will understand that any system configured to perform the method 400 with any technically feasible order of steps falls within the scope of the present disclosure. FIGS. 4A-4D will now be discussed together.

FIG. 4B illustrates aspects of a clock system 450 that is part of the APD 116 of FIG. 1, according to an example. The clock system 450 includes one or more clock generators 452, a clock crossbar 454, one or more clock domains 456, a clock control logic 460, and measurement circuits 462. Each clock generator 452 comprises a circuit configured to generate a clock signal for provision to parts of the APD 116. Each clock generator 452 may be implemented in any technically feasible manner. In one example, one or more clock generators 452 includes a phase locked loop that generates a clock signal based on a reference clock signal.

In other examples, one or more clock generators 452 generates clock signals adaptively, based on the propagation of signals through replica circuits. Any technically feasible means for generating a clock signal may be performed by the clock generators 452.

The clock crossbar 454 selectively distributes the one or more clock signals generated by the one or more clock generators 452 to one or more clock domains 456. Any technically feasible system for implementing the clock crossbar 454 may be used. Each clock domain 456 represents a different portion of the APD 116. In one example, illustrated in the example system 450(1) of FIG. 4C, the clock domains 456 are each compute units 132. In such an example, it is possible for each compute unit 132 to operate at different clock frequencies, although it is also possible for two or more compute units 132 to operate at the same clock frequency. In another example, illustrated in the example system 450(2) of FIG. 4D, the clock domains 456 are each shader engines 131. In such an example, it is possible for each shader engine 131 to operate at different clock frequencies, although it is also possible for two or more shader engines 131 to operate at the same clock frequency.

The clock control logic 460 controls the clock crossbar 454 to select particular clock generators 452 to transmit clock signals to particular clock domains 456. The selection is based on one or more measurement circuits 462. The measurement circuits 462 measure aspects of the clock domains 456 and provide signals indicative of such measurements to the clock control logic 460 for controlling the clock crossbar 454 to select particular clock generators 452 for providing clock signals to particular clock domains 456. In one example, the measurement circuits 462 include one or more replica circuits for each clock domain 456. Each replica circuit represents a circuit path that exists within the clock domain 456 and that is deemed to have a high amount of propagation delay within the clock domain 456, where the term "propagation delay" represents the time for propagation of a signal from one clocked element (e.g., flip-flop) through a circuit path to another clocked element. In various examples, a "high" amount of propagation delay means that the circuit path has the highest amount of propagation delay out of all circuit paths within the clock domain 456 or that the circuit path has an amount of propagation delay that is above a threshold percentage (e.g., 95%) of the highest amount of propagation delay out of all circuit paths within the clock domain 456. The measurement circuits 462 are considered to produce "accurate" measurements for particular clock domains 456 due to being physically within those clock domains 456 and thus subject to the same physical characteristics that affect the propagation delay through circuits elements within the clock domain 456.

In some examples, specific measurement circuit paths are designed and/or designated either by a human designer or an automated tool (such as a software circuit analyzer), or by both a human designer and an automated tool working in conjunction. In various examples, the clock control logic 460 is implemented as a hard-coded circuit that interfaces with the measurement circuits 462 and the clock crossbar 454. In other examples, the clock control logic 460 is implemented as a microcontroller that executes firmware for performing the functions described herein. Any technically feasible way to implement the clock control logic 460 is possible. For each of the clock domains 456, the clock control logic 460 selects a clock signal based on the propagation delay through the one or more measurement circuits 462. For any particular clock domain 456, the clock signal is selected such that the slowest propagation delay out of the propagation delays measured by the measurement circuits 462 occurs within one clock period (e.g., the reciprocal of clock frequency).

The intent of allowing different clock signals to be applied to different clock domains 456 is to provide a fine-granularity speed binning for APDs 116. More specifically, as described above, processing devices such as the APD 116 are typically characterized based on the maximum clock frequency that such processing device can operate at in a stable manner, given a specific power supply voltage. This characterization is referred to as "speed-binning," which assigns the processing device to a particular speed class. In typical scenarios, speed binning occurs on a chip-wide level. In that scenario, an entire APD 116 would be classified into a single speed bin which would be applied across the entire APD 116.

In the system described herein, speed binning occurs for each different clock domain 456. Specifically, each clock domain 456 is characterized as belonging to a particular speed bin based on the results of the measurement circuits 462. This selection is done at manufacture time of the APD 116 or at sometime early in the life of the APD 116, but could also be done at a later time. In other words, the clock control logic 460 obtains the propagation delay measurements for each clock domain 456 and assigns a speed bin to each clock domain 456 based on the propagation delay measurements. During operation, the clock control logic 460 assigns particular clock signals form particular clock generators 452 to particular clock domains 456 based on the speed bins assigned to the clock domains 456. In some examples, the clock control logic 460 stores indications of the speed bins assigned to each clock domain 456 within a data storage element within the APD 116. The data storage element may be any element that can store data, such as a non-volatile storage element, or even a hard-wired circuit element configured to indicate particular values. Any technically feasible technique for storing data indicative of speed bins is possible. In examples that include the data storage element, the clock control logic 460 examines the data storage element and applies clock signals from the clock generators 452 to the clock domains 456 according to the indicated speed bins for each clock domain 456. Method 400 of FIG. 4A describes this process.

As shown, the method 400 begins at step 402, where a clock control logic 460 obtains propagation delay measurements from one or more measurement circuits 462 for a clock domain 456. At step 404, the clock control logic 460 determines a speed bin for the clock domain 456 based on the one or more measurements. In one example, the clock control logic 460 determines a speed bin based on the slowest propagation delay measurement for the clock domain 456, and selects the speed bin such that the slowest propagation delay measurement is within a clock period for the selected speed bin. For performance, in such examples, the clock control logic 460 selects the fastest speed bin whose corresponding clock period would be at least as long as the slowest propagation delay measurement.

At step 406, the clock control logic 460 sets the clock speed for the speed domain 456 based on the speed bin chosen for that domain. Setting the clock speed includes causing the clock crossbar 454 to forward a clock signal from a clock generator 452 to the appropriate clock domain 456. The selected clock signal would match the clock speed assigned to the speed bin chosen for the speed domain 456.

At step 408, the clock control logic 460 determines whether there are more clock domains 456 to analyze. If there are more clock domains 456 to analyze, then the method 400 returns to step 402, and if there are no more clock domains 456 to analyze, then the method 400 proceeds to step 410, where the method 400 ends. Variations to method 400 are possible. For example, in addition to allowing for fine-grained clock speed control for speed binning purposes, the multiple clock domains 456 also allow for on-the-fly adjustment (e.g., during operation of the APD 116) of the clock speeds for the different clock domains 456, independently of each other. In addition, the speed bins assigned to particular clock domains 456 may change over time as the circuit ages. More specifically, propagation delays through circuits typically increase as the circuit ages. In such situations, the measurement circuits 462 take periodic measurements, and, based on these measurements, the clock control logic 460 adjusts the speed bins assigned to the particular clock domains 456. Also, instead of, or in addition to replica circuits, the measurement circuits 462 may be simple ring oscillators. A comparison of the speed results from the ring oscillators distributed throughout the different clock domains 456 would allow for selection of a speed bin for particular clock domains 456. A faster result through ring oscillators would result in selection of a faster speed bin for the clock domain 456 and a slower result through ring oscillators would result in selection of a slower speed bin for the clock domain 456.

Figure 5A:
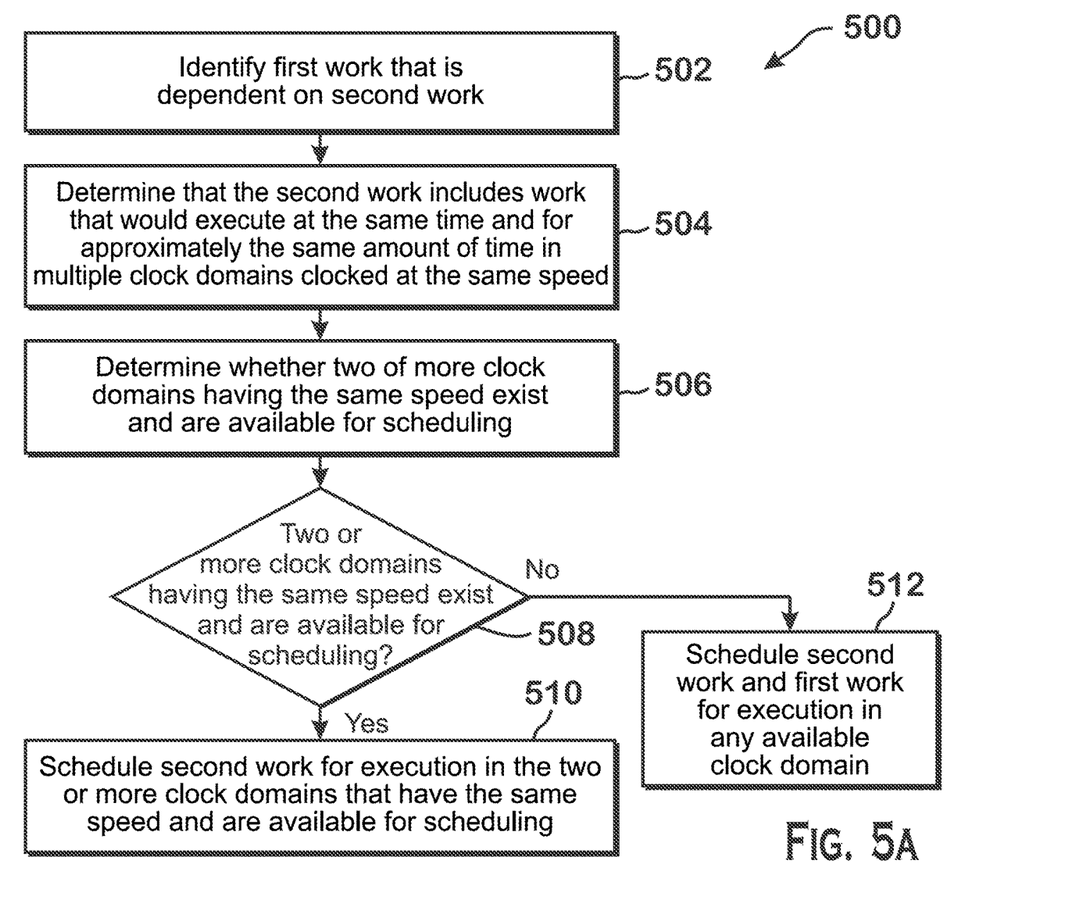
FIG. 5A is a flow diagram of a method for assigning work in an accelerated processing device including multiple individually speed-binned clock domains, according to an example.

Several techniques are provided herein for scheduling workloads to different clock domains 456 based on the fact that different clock domains 456 may be running with different clock speeds. In one technique, similar workloads that could be executed at the same time in multiple different clock domains 456 are scheduled in clock domains 456 assigned to the same speed bin if there is further work that is dependent on the similar workloads. In other words, if first work is dependent on second work, and the second work requires enough resources to be schedulable for execution in multiple different clock domains 456, then the APD scheduler 136 (FIG. 2) schedules the first work in multiple different clock domains 456 having the same clock speed, if such multiple different clock domains 456 are available to accept work. The purpose of such a scheduling regime is to prevent the performance hit resulting from staggered work completion times due to the differing clock speeds. For example, if the second work were scheduled at the same time in different clock domains 456, then some of the second work would complete before the remaining portion of the second work. If the first work could not complete before all of the second work is completed due to dependencies, then the difference in time between completion of the first and second portions of the second work could be thought of as representing wasted processing time. FIG. 5A presents a technique for addressing this issue.

FIG. 5A is a flow diagram of a method 500 for assigning work in an APD 116 including multiple individually speed-binned clock domains 456, according to an example. Although described with respect to the system of FIGS. 1-3 and 4A, those of skill in the art will understand that any system configured to perform the method 500 with any technically feasible order of steps falls within the scope of the present disclosure.

As shown, the method 500 begins at step 502, where the APD scheduler 136 identifies first work that is dependent on second work. At step 504, the APD scheduler 136 determines that the second work includes work that would execute at the same time and for approximately the same amount of time in multiple clock domains 456 clocked at the same speed. At step 506, the APD scheduler 136 determines whether there are two or more clock domains 456 having the same speed that are available for scheduling work to. At step 508, if there are two or more clock domains that have the same speed and are available for scheduling work to, then the method 500 proceeds to step 510 and if there are not two or more clock domains that have the same speed and are available for scheduling work to, then the method 500 proceeds to step 510. At step 510, the APD scheduler 136 schedules the second work for execution in the two or more clock domains 456 that have the same speed and are available for scheduling.

Figure 5B:
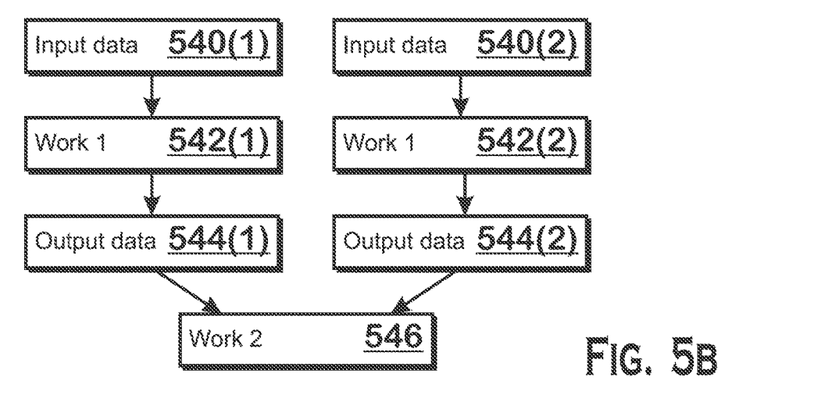
FIG. 5B illustrates an example of scheduling based on dependencies.

FIG. 5B illustrates an example of the scheduling based on dependencies. Work 1 542 represents a first type of work. Two instances of work 1 represent two different portions of the first type of work. Work 1 542 accepts input data 540 and provides output data 544. Work 2 546 accepts output data 544 from, and is thus dependent on, both instances of work 1 542. In this example, the APD scheduler 136 schedules work 1 542(1) and work 1 542(2) for execution in clock domains 456 having the same clock speed so that the output data 544 is available at approximately the same time.

One example of the situation illustrated in FIG. 5B is a situation in which work 1 542 and work 2 546 represent different kernels to be executed on the APD 116. A kernel represents a program that is executed multiple times for different work-items, each work-item executing the same program—the kernel. Kernels are able to execute for a given number of work-items. In some instances, the number of work-items to execute a kernel is larger than the number of SIMD lanes in any given clock domain 456. In such instances, the APD scheduler 136 may schedule the work-items for execution in multiple clock domains 456. Thus work 1 542(1) and work 1 542(2) would represent different instances of the same kernel executing in multiple clock domains 546. Work 2 546 would also represent a kernel that is dependent on the output of the kernel represented by work 1.

Figure 6:
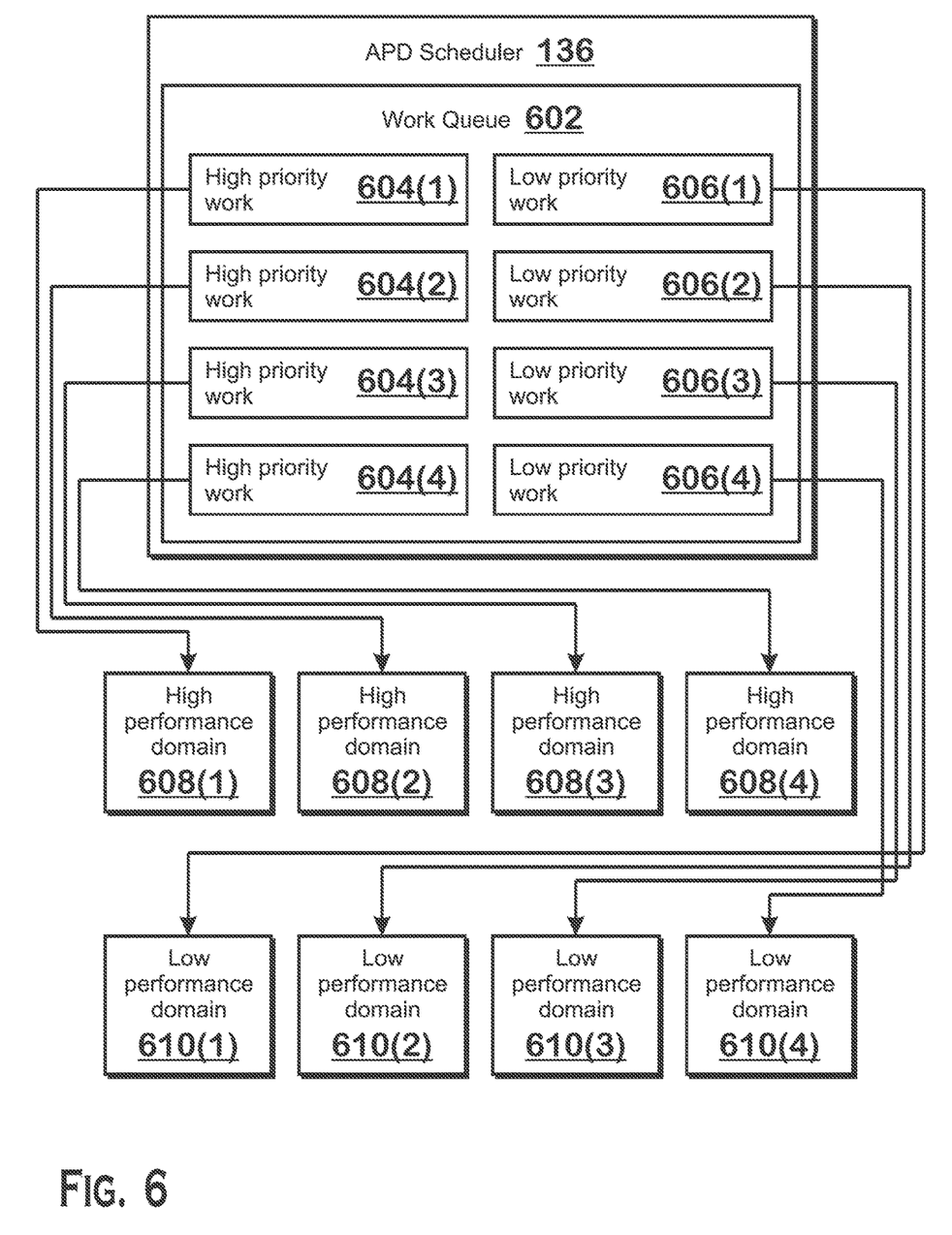
FIG. 6 illustrates another technique for scheduling work in an accelerated processing device including multiple individually speed-binned clock domains, according to an example.

FIG. 6 illustrates another technique for scheduling work in an APD 116 including multiple individually speed-binned clock domains 456, according to an example. In FIG. 6, an APD scheduler 136 is illustrated including a work queue 602. The work queue 602 illustrates high priority work 604 and low priority work 606 for scheduling for execution in the clock domains 456. In the technique of FIG. 6, the APD scheduler 136 preferentially assigns high priority work 604 to high performance clock domains 608 and schedules low priority work 606 to low performance clock domains 610 if high performance domains 608 are unavailable. A high performance domain 608 is a domain that has a higher clock frequency than a low performance domain 610. "Preferentially" assigning high priority work 604 to high performance clock domains 608 means that there is a higher likelihood that the APD scheduler 136 schedules high priority work 604 to a high performance clock domain 608 than to a low performance domain 610 and that there is a higher likelihood that the APD scheduler 136 schedules high priority work 604 to a high performance clock domain 608 than that the APD scheduler 136 schedules low priority work 606 to a high performance domain 608.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for fine-grained speed-binning of a processing device, the method comprising:
propagating a first set of one or more signals through a first set of one or more measurement circuits associated with a first clock domain of the processing device;
identifying, out of a plurality of speed bins, a first speed bin for the first clock domain, based on a first set of one or more results of the first set of one or more signals propagating through the first set of one or more measurement circuits;
propagating a second set of one or more signals through a second set of one or more measurement circuits associated with a second clock domain of the processing device;
identifying, out of the plurality of speed bins, a second speed bin for the second clock domain, based on a second set of one or more results of the second set of one or more signals propagating through the second set of one or more measurement circuits; and
responsive to determining that a first workload is dependent on both a second workload and a third workload, that the first clock domain and a third clock domain are assigned to an identical speed bin, and that the first clock domain and the third clock domain are available for scheduling, scheduling the second workload for execution within the first clock domain and scheduling the third workload for execution within the third clock domain.

2. The method of claim 1, further comprising:
configuring the processing device to apply a first clock signal associated with the first speed bin to the first clock domain; and
configuring the processing device to apply a second clock signal associated with the second speed bin to the second clock domain.

3. The method of claim 2, wherein configuring the processing device to apply the first clock signal associated with the first speed bin to the first clock domain comprises:
storing, in a data element, an indication that the first clock domain is associated with the first speed bin.

4. The method of claim 3, further comprising:
applying the first clock signal to the first clock domain by detecting that the data element stores the indication that the first clock domain is associated with the first speed bin, and, in response, causing a clock crossbar to provide the first clock signal to the first clock domain.

5. The method of claim 1, wherein:
each of the signals of the first set of one or more signals that is propagated through the first set of one or more measurement circuits is associated with a propagation delay; and
identifying, out of the plurality of speed bins, the first speed bin for the first clock domain, comprises identifying the first speed bin as the speed bin of the plurality of speed bins having a fastest clock speed that would support a longest propagation delay of the propagation delays of the signals of the first set of one or more signals.

6. The method of claim 1, further comprising:
scheduling work for execution in the first clock domain and in the second clock domain based on the first speed bin assigned to the first clock domain and the second speed bin assigned to the second clock domain.

7. The method of claim 6, wherein:
the work scheduled for execution comprises work upon which second work is dependent and that can be scheduled on processing units both within the first clock domain and the second clock domain;
the first speed bin and the second speed bin are identical speed bins associated with an identical clock speed; and
scheduling the work for execution in the first clock domain and the second clock domain comprises scheduling the work for execution on both the first clock domain and the second clock domain together so that the work completes at approximately the same time, due to the first speed bin and the second speed bin being associated with the same clock speed.

8. The method of claim 6, wherein scheduling work for execution in the first clock domain and in the second clock domain based on the speed bins assigned to the first clock domain and the second clock domain comprises:
scheduling first work to the first clock domain; and
scheduling second work to the second clock domain,
wherein the first clock domain has a faster clock speed than the second clock domain, and
wherein the first work is scheduled to the first clock domain due to the first work having a higher priority than the second work and also due to the fact that the first clock domain has a faster clock speed than the second clock domain.

9. The method of claim 1, wherein:
the first clock domain and the second clock domain comprises one of a compute unit including a plurality of single instruction multiple data (SIMD) units or a shader engine including a plurality of compute units.

10. A system for fine-grained speed-binning of a processing device, the system comprising:
a first clock domain and a second clock domain;
a first set of one or more measurement circuits associated with the first clock domain, the first set of one or more measurement circuits configured to propagate a first set of one or more signals;
a second set of one or more measurement circuits associated with the second clock domain, the second set of one or more measurement circuits configured to propagate a second set of one or more signals;
a clock control logic configured to:
identify, out of a plurality of speed bins, a first speed bin for the first clock domain, based on the first set of one or more results of the first set of one or more signals propagating through the first set of one or more measurement circuits, and
identify, out of the plurality of speed bins, a second speed bin for the second clock domain, based on the second set of one or more results of the second set of one or more signals propagating through the second set of one or more measurement circuits; and
a scheduler configured to, responsive to determining that a first workload is dependent on both a second workload and a third workload, that the first clock domain and a third clock domain are assigned to an identical speed bin, and that the first clock domain and the third clock domain are available for scheduling, schedule the second workload for execution within the first clock domain and schedule the third workload for execution within the third clock domain.

11. The system of claim 10, wherein the clock control logic is further configured to:
configure the processing device to apply a first clock signal associated with the first speed bin to the first clock domain; and
configure the processing device to apply a second clock signal associated with the second speed bin to the second clock domain.

12. The system of claim 11, wherein the clock control logic is configured to configure the processing device to apply the first clock signal associated with the first speed bin to the first clock domain by:
storing, in a data element, an indication that the first clock domain is associated with the first speed bin.

13. The system of claim 12, further comprising:
a clock crossbar,
wherein the clock control logic is further configured to apply the first clock signal to the first clock domain by detecting that the data element stores the indication that the first clock domain is associated with the first speed bin, and, in response, cause a clock crossbar to provide the first clock signal to the first clock domain.

14. The system of claim 10, wherein:
each of the signals of the first set of one or more signals that is propagated through the first set of one or more measurement circuits is associated with a propagation delay; and
the clock control logic is configured to identify, out of the plurality of speed bins, the first speed bin for the first clock domain, by identifying the first speed bin as the speed bin of the plurality of speed bins having a fastest clock speed that would support a longest propagation delay of the propagation delays of the signals of the first set of one or more signals.

15. The system of claim 10, further comprising:
an accelerated processing device scheduler ("APD scheduler") configured to schedule work for execution in the first clock domain and in the second clock domain based on the first speed bin assigned to the first clock domain and the second speed bin assigned to the second clock domain.

16. The system of claim 15, wherein:
the work scheduled for execution comprises work upon which second work is dependent and that can be scheduled on processing units both within the first clock domain and the second clock domain;

the first speed bin and the second speed bin are identical speed bins associated with an identical clock speed; and the APD scheduler is configured to schedule the work for execution in the first clock domain and the second clock domain by scheduling the work for execution on both the first clock domain and the second clock domain together so that the work completes at approximately the same time, due to the first speed bin and the second speed bin being associated with the same clock speed.

17. The system of claim 15, wherein the APD scheduler is configured to schedule work for execution in the first clock domain and in the second clock domain based on the speed bins assigned to the first clock domain and the second clock domain by:

scheduling first work to the first clock domain; and scheduling second work to the second clock domain, wherein the first clock domain has a faster clock speed than the second clock domain, and wherein the first work is scheduled to the first clock domain due to the first work having a higher priority than the second work and also due to the fact that the first clock domain has a faster clock speed than the second clock domain.

18. The system of claim 10, wherein:

the first clock domain and the second clock domain comprises one of a compute unit including a plurality of single instruction multiple data (SIMD) units or a shader engine including a plurality of compute units.

19. An accelerated processing device comprising:

a graphics processing pipeline configured to execute graphics commands and to pass work to a first clock domain and a second clock domain for the execution of the graphics commands;

a first set of one or more measurement circuits associated with the first clock domain, the first set of one or more measurement circuits configured to propagate a first set of one or more signals;

a second set of one or more measurement circuits associated with the second clock domain, the second set of one or more measurement circuits configured to propagate a second set of one or more signals;

a clock control logic configured to:

identify, out of a plurality of speed bins, a first speed bin for the first clock domain, based on the first set of one or more results of the first set of one or more signals propagating through the first set of one or more measurement circuits, and identify, out of the plurality of speed bins, a second speed bin for the second clock domain, based on the second set of one or more results of the second set of one or more signals propagating through the second set of one or more measurement circuits; and a scheduler configured to, responsive to determining that a first workload is dependent on both a second workload and a third workload, that the first clock domain and a third clock domain are assigned to an identical speed bin, and that the first clock domain and the third clock domain are available for scheduling, schedule the second workload for execution within the first clock domain and schedule the third workload for execution within the third clock domain.

20. The system of claim 19, wherein:

the first clock domain and the second clock domain comprises one of a compute unit including a plurality of single instruction multiple data (SIMD) units or a shader engine including a plurality of compute units.

* * * * *